(12) United States Patent
Fang et al.

(10) Patent No.: US 10,734,427 B2
(45) Date of Patent: Aug. 4, 2020

(54) METHOD FOR FORMING IMAGE SENSOR DEVICE

(71) Applicant: Taiwan Semiconductor Manufacturing Co., Ltd., Hsinchu (TW)

(72) Inventors: Chun-Chieh Fang, Zhongpu Township (TW); Ming-Chi Wu, Kaohsiung (TW); Ji-Heng Jiang, Tainan (TW); Chi-Yuan Wen, Tainan (TW); Chien-Nan Tu, Kaohsiung (TW); Yu-Lung Yeh, Kaohsiung (TW); Shih-Shiung Chen, Tainan (TW); Kun-Yu Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/277,375

(22) Filed: Feb. 15, 2019

(65) Prior Publication Data
US 2019/0181174 A1 Jun. 13, 2019

Related U.S. Application Data

(62) Division of application No. 15/638,971, filed on Jun. 30, 2017, now Pat. No. 10,211,244.

(51) Int. Cl.
*H01L 31/0232* (2014.01)
*H01L 27/146* (2006.01)

(52) U.S. Cl.
CPC .... *H01L 27/14629* (2013.01); *H01L 27/1463* (2013.01); *H01L 27/14621* (2013.01); *H01L 27/14645* (2013.01); *H01L 27/14685* (2013.01)

(58) Field of Classification Search
CPC ......... H01L 27/14629; H01L 27/14685; H01L 27/14645; H01L 27/14621
See application file for complete search history.

(56) References Cited

U.S. PATENT DOCUMENTS

| | | |
|---|---|---|
| 8,847,297 B2 | 9/2014 | Kim et al. |
| 9,305,951 B2 | 4/2016 | Kang et al. |
| 10,008,535 B2 | 6/2018 | Lee et al. |
| 2008/0315338 A1 | 12/2008 | Yeo |
| 2009/0315131 A1 | 12/2009 | Hung et al. |
| 2010/0323470 A1 | 12/2010 | Venezia et al. |
| 2012/0012960 A1 | 1/2012 | Yang et al. |

(Continued)

*Primary Examiner* — Ismail A Muse
(74) *Attorney, Agent, or Firm* — Birch, Stewart, Kolasch & Birch, LLP (57) ABSTRACT

A method for forming an image sensor device is provided. The method includes providing a semiconductor substrate including a front surface, a back surface opposite to the front surface, at least one light-sensing region close to the front surface, and a first trench surrounding the light-sensing region. The method includes forming an insulating layer over the back surface and in the first trench. A void is formed in the insulating layer in the first trench, and the void is closed. The method includes removing the insulating layer over the void to open up the void. The opened void forms a second trench partially in the first trench. The method includes filling a reflective structure in the second trench. The reflective structure has a light reflectivity ranging from about 70% to about 100%.

20 Claims, 10 Drawing Sheets

(56) References Cited

U.S. PATENT DOCUMENTS

| | | | |
|---|---|---|---|
| 2012/0033119 A1* | 2/2012 | Shinohara | H01L 27/14623 |
| | | | 348/302 |
| 2014/0015085 A1 | 1/2014 | Ikeda et al. | |
| 2014/0054662 A1 | 2/2014 | Yanagita et al. | |
| 2014/0232918 A1* | 8/2014 | Shinohara | H01L 27/14623 |
| | | | 348/308 |
| 2014/0239361 A1 | 8/2014 | Ma | |
| 2015/0001663 A1 | 1/2015 | Lee et al. | |
| 2015/0091121 A1 | 4/2015 | Manda et al. | |
| 2015/0243696 A1 | 8/2015 | Chien et al. | |
| 2015/0243697 A1 | 8/2015 | Chien et al. | |
| 2015/0243805 A1 | 8/2015 | Chien et al. | |
| 2016/0190200 A1* | 6/2016 | Shinohara | H01L 27/14623 |
| | | | 257/292 |
| 2016/0276381 A1 | 9/2016 | Park | |
| 2017/0047367 A1 | 2/2017 | Lee et al. | |
| 2017/0047371 A1* | 2/2017 | Lee | H01L 27/14643 |
| 2017/0098671 A1* | 4/2017 | Shinohara | H01L 27/14623 |
| 2017/0271385 A1* | 9/2017 | Yanagita | H01L 27/14685 |
| 2017/0317119 A1* | 11/2017 | Shinohara | H01L 27/14623 |
| 2018/0061873 A1 | 3/2018 | Lee et al. | |
| 2018/0069043 A1 | 3/2018 | Pan et al. | |
| 2018/0151759 A1 | 5/2018 | Huang et al. | |
| 2018/0294296 A1* | 10/2018 | Shinohara | H01L 27/14623 |
| 2019/0157325 A1* | 5/2019 | Shinohara | H01L 27/14623 |

\* cited by examiner

METHOD FOR FORMING IMAGE SENSOR DEVICE

CROSS REFERENCE

This application is a Divisional of U.S. application Ser. No. 15/638,971, filed on Jun. 30, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices (e.g., image sensors) at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1H-1 is a top view of the image sensor device of FIG. 1H, in accordance with some embodiments.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1A:
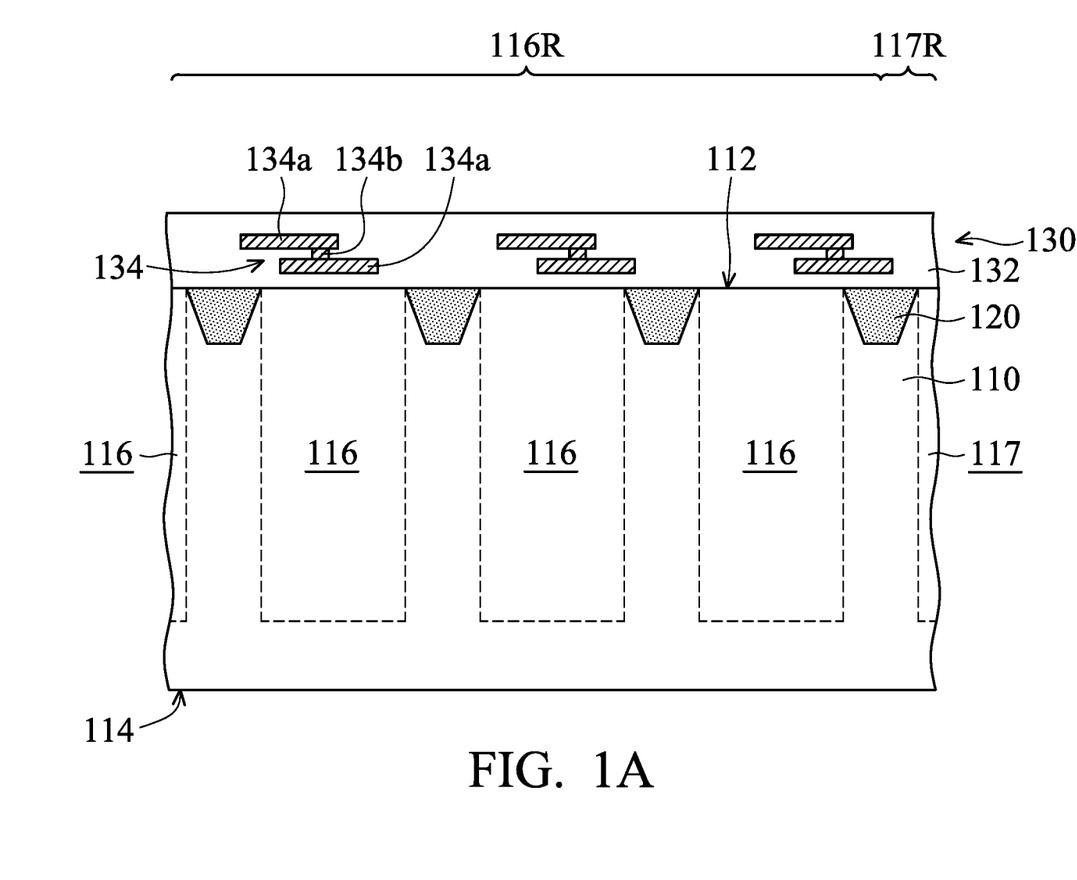
FIGS. 1A-1I are cross-sectional views of various stages of a process for forming an image sensor device, in accordance with some embodiments.

FIGS. 1A-1I are cross-sectional views of various stages of a process for forming an image sensor device 200, in accordance with some embodiments. As shown in FIG. 1A, a semiconductor substrate 110 is provided. The semiconductor substrate 110 has a front surface 112 and a back surface 114 opposite to the front surface 112.

The semiconductor substrate 110 may be a silicon substrate doped with a P-type dopant such as boron, in which case the semiconductor substrate 110 is a P-type substrate. Alternatively, the semiconductor substrate 110 could be another suitable semiconductor material. For example, the semiconductor substrate 110 may be a silicon substrate doped with an N-type dopant such as phosphorous or arsenic, in which case the substrate is an N-type substrate. The semiconductor substrate 110 may include another elementary semiconductor material such as germanium.

In some embodiments, isolation structures 120 are formed in the semiconductor substrate 110 to define various light-sensing regions in the semiconductor substrate 110, and to electrically isolate neighboring devices (e.g. transistors) from one another. In some embodiments, the isolation features 120 are formed adjacent to or near the front surface 112.

In some embodiments, the isolation structures 120 are made of a dielectric material, such as silicon oxide, silicon nitride, silicon oxynitride, fluoride-doped silicate glass (FSG), a low-K dielectric material, another suitable material, or a combination thereof. In some embodiments, the isolation structures 120 are formed by using an isolation technology, such as local oxidation of semiconductor (LOCOS), shallow trench isolation (STI), or the like.

In some embodiments, the formation of the isolation structures 120 includes patterning the semiconductor substrate 110 by a photolithography process, etching trenches in the semiconductor substrate 110 (for example, by using a dry etching, wet etching, plasma etching process, or a combination thereof), and filling the trenches (for example, by using a chemical vapor deposition process) with the dielectric material. In some embodiments, the filled trenches may have a multi-layer structure, such as a thermal oxide liner layer and a silicon nitride layer (or a silicon oxide layer) formed thereon.

In some embodiments, the semiconductor substrate 110 is fabricated with front end processes, in accordance with some embodiments. For example, the semiconductor substrate 110 includes various regions, which may include a pixel region 116R and a non-pixel region 117R (e.g., a logic region, a periphery region, a bonding pad region, and/or a scribe line region).

The pixel region 116R includes pixels each with a light-sensing region 116 (also referred to as a radiation-sensing region). The light-sensing regions 116 of the pixels are doped with a doping polarity opposite from that of the semiconductor substrate 110. The light-sensing regions 116 are formed by one or more implantation processes or diffusion processes.

The light-sensing regions 116 are formed close to (or adjacent to, or near) the front surface 112 of the semiconductor substrate 110. The light-sensing regions 116 are operable to sense incident light (or incident radiation) that enters the pixel region 116R. The incident light may be visible light. Alternatively, the incident light may be infrared (IR), ultraviolet (UV), X-ray, microwave, another suitable type of light, or a combination thereof.

In some embodiments, the pixel region 116R further includes pinned layers, photodiode gates, reset transistors, source follower transistors, and transfer transistors. The transfer transistors are electrically connected with the light-sensing regions 116 to collect (or pick up) electrons generated by incident light (incident radiation) traveling into the light-sensing regions 116 and to convert the electrons into voltage signals, in accordance with some embodiments. For the sake of simplicity, detailed structures of the above features are not shown in the figures of the present disclosure.

The non-pixel region 117R includes non-light-sensing regions 117. The non-light-sensing regions 117 are doped with a doping polarity opposite from or the same as that of the semiconductor substrate 110. The non-light-sensing regions 117 are formed by one or more implantation processes or diffusion processes. The non-light-sensing regions 117 are formed close to (or adjacent to, or near) the front surface 112 of the semiconductor substrate 110.

In some embodiments, an interconnection structure 130 is formed over the front surface 112. The interconnection structure 130 includes a number of patterned dielectric layers and conductive layers, in accordance with some embodiments. For example, the interconnection structure 130 includes an interlayer dielectric (ILD) layer 132 and a multilayer interconnection (MLI) structure 134 in the ILD layer 132.

The MLI structure 134 is electrically connected to various doped features, circuitry, photodiode gates, reset transistors, source follower transistors, and/or transfer transistors formed in and/or over the semiconductor substrate 110, in accordance with some embodiments.

The MLI structure 134 includes conductive lines 134a and vias (or contacts) 134b connected between the conductive lines 134a. It should be understood that the conductive lines 134a and the vias 134b are merely exemplary. The actual positioning and configuration of the conductive lines 134a and the vias 134b may vary depending on design needs and manufacturing concerns.

Figure 1B:
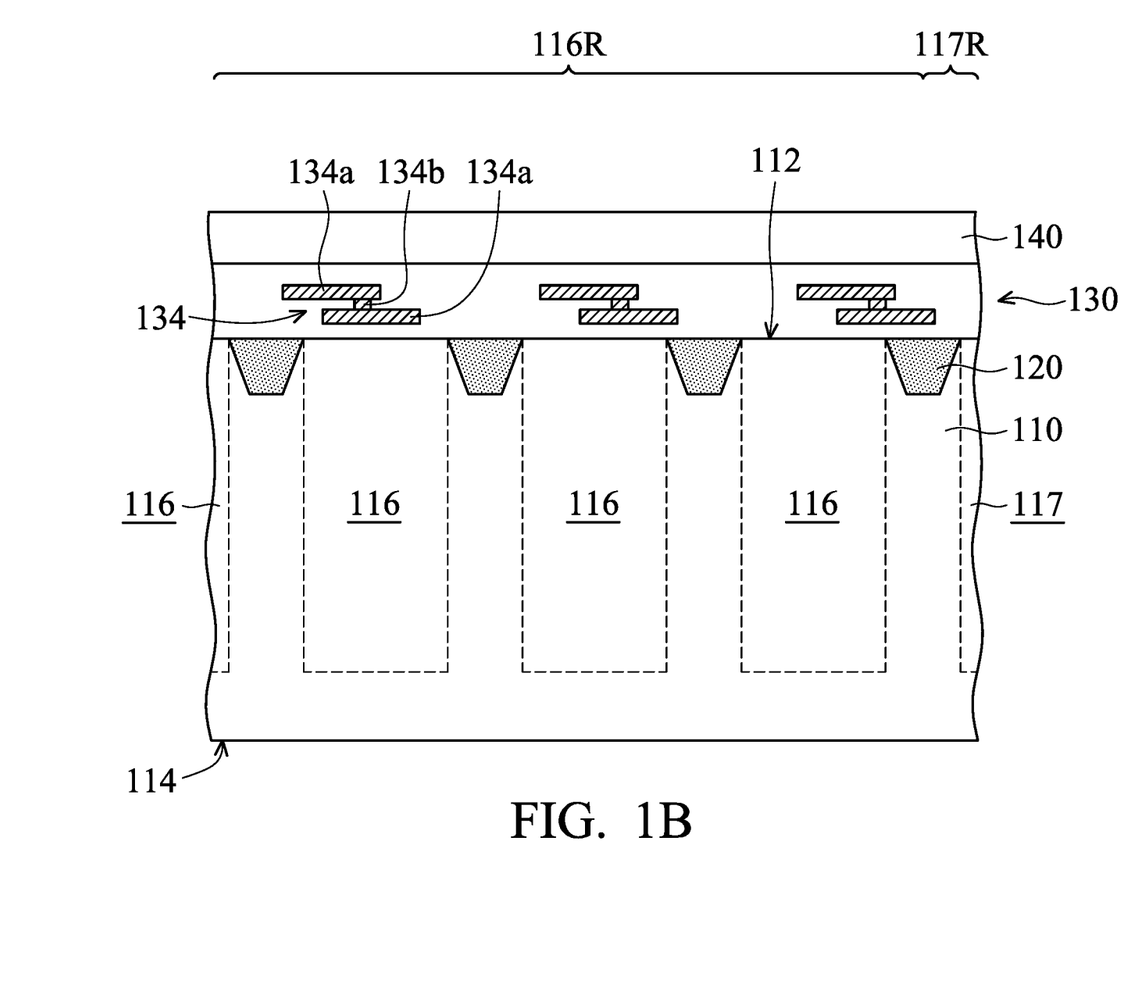
Figure 1C:
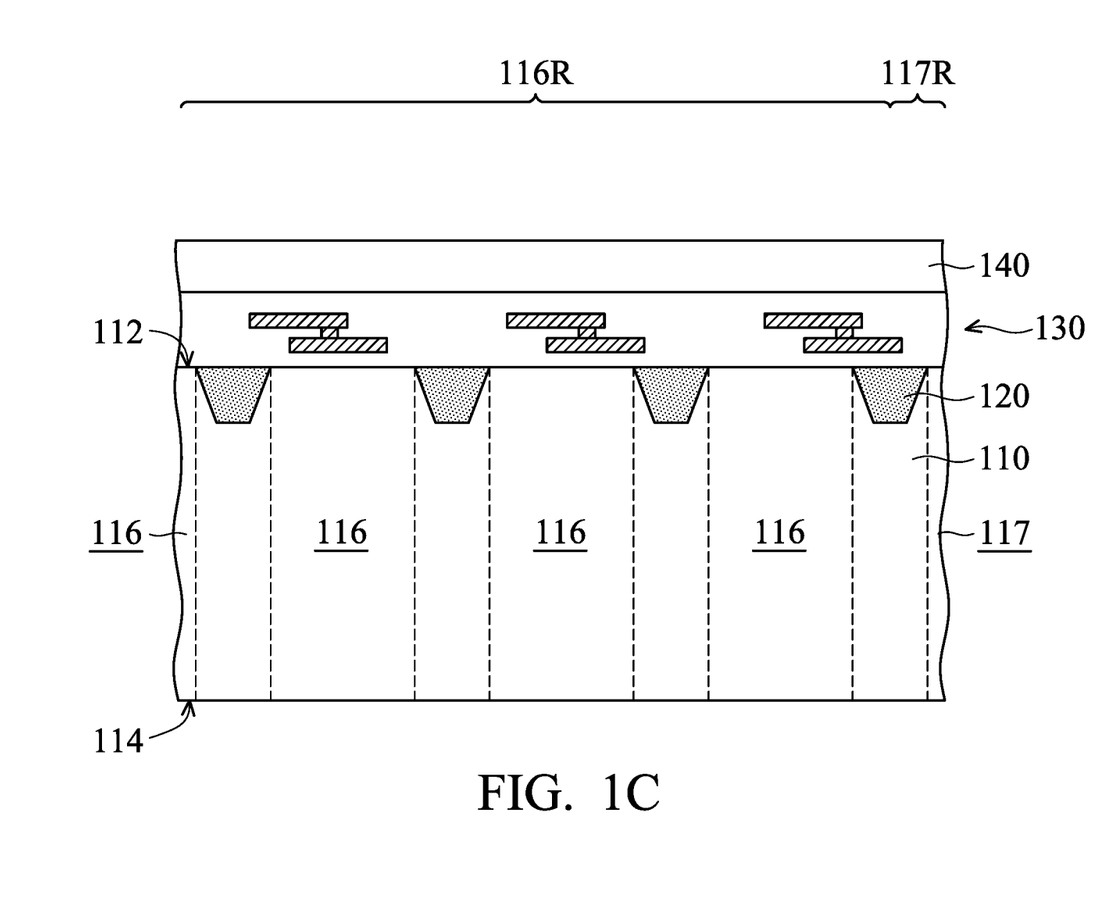

Afterwards, as shown in FIG. 1B, a carrier substrate 140 is bonded with the interconnection structure 130, in accordance with some embodiments. The carrier substrate 140 includes a silicon substrate, a glass substrate, or another suitable substrate. Thereafter, as shown in FIGS. 1B and 1C, a thinning process is performed to thin the semiconductor substrate 110 from the back surface 114. The thinning process may include a chemical mechanical polishing process.

Figure 1D:
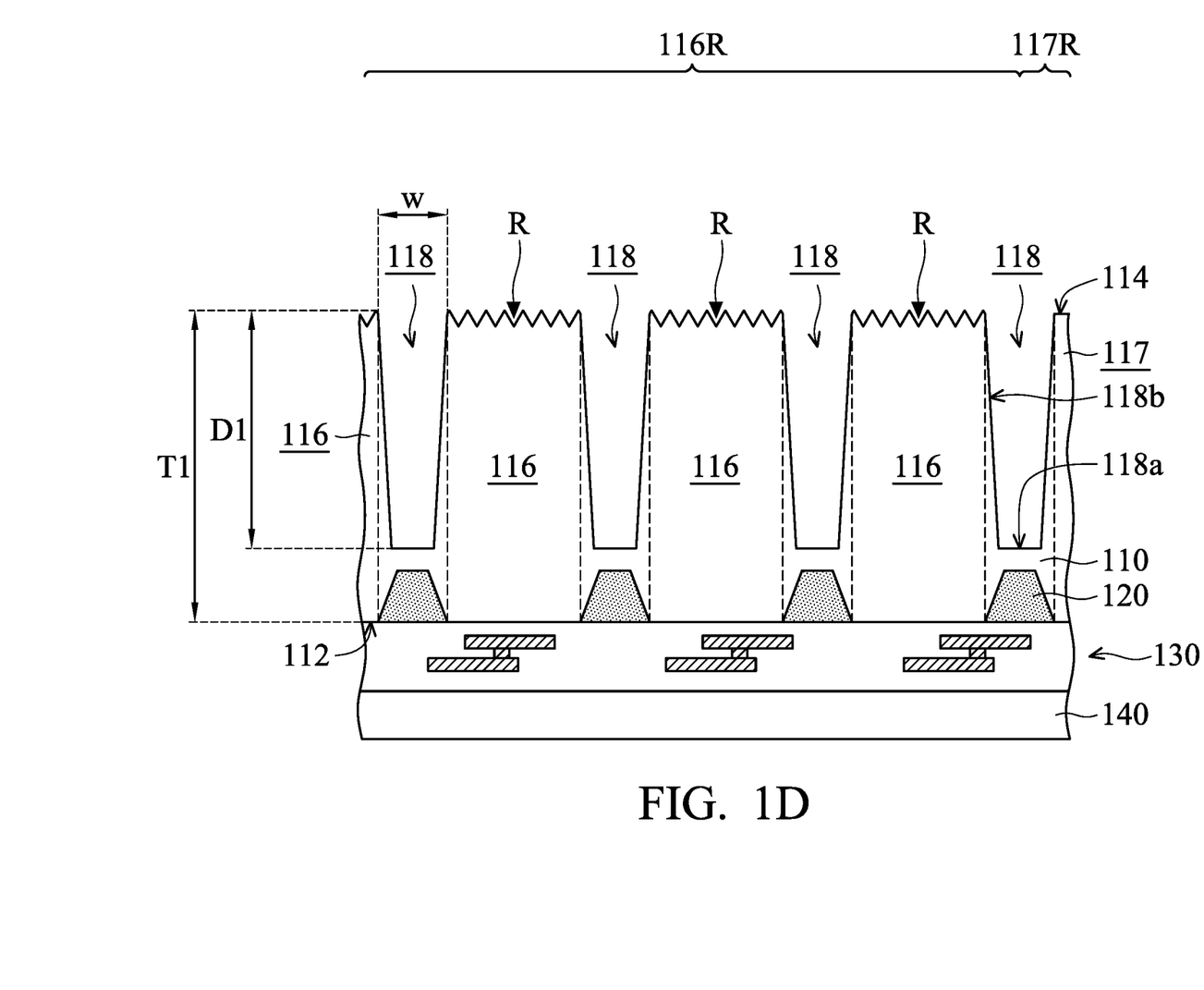

Afterwards, as shown in FIG. 1D, the semiconductor substrate 110 is flipped over, in accordance with some embodiments. As shown in FIG. 1D, a portion of the semiconductor substrate 110 adjacent to the back surface 114 over the light-sensing region 116 is removed, in accordance with some embodiments. The removal of the portion of the semiconductor substrate 110 increases the average roughness of the back surface 114 over the light-sensing region 116, in accordance with some embodiments.

Therefore, the increase of the average roughness of the back surface 114 over the light-sensing region 116 reduces optical reflection from the back surface 114 over the light-sensing region 116 to ensure that most of the incident light enters the light-sensing regions 116 and is sensed, in accordance with some embodiments. Therefore, the quantum efficiency of the light sensing regions 116 is improved by the increase of the average roughness of the back surface 114 over the light-sensing region 116, in accordance with some embodiments.

The removal of the portion of the semiconductor substrate 110 forms recesses R in the semiconductor substrate 110 in the pixel region 116R, in accordance with some embodiments. The removal of the portion of the semiconductor substrate 110 includes forming a mask layer (not shown) over the back surface 114 in the non-pixel region 117R; performing an etching process; and removing the mask layer, in accordance with some embodiments. The etching process includes a dry etching process or a wet etching process, in accordance with some embodiments.

The recesses R are only formed in the semiconductor substrate 110 in the pixel region 116R and are not formed in the semiconductor substrate 110 in the non-pixel region 117R, in accordance with some embodiments. Therefore, the average roughness of the back surface 114 over the light-sensing region 116 is greater than the average roughness of the back surface 114 over the non-light-sensing region 117, in accordance with some embodiments.

As shown in FIG. 1D, trenches 118 are formed in the semiconductor substrate 110, in accordance with some embodiments. The trenches 118 extend from the back surface 114 toward the front surface 112, in accordance with some embodiments. The trenches 118 are between the light-sensing regions 116 or between the light-sensing region 116 and the non-light-sensing region 117, in accordance with some embodiments.

The trenches 118 respectively surround the light-sensing regions 116 and the non-light-sensing region 117, in accordance with some embodiments. The light-sensing regions 116 are separated from each other by the trenches 118, in accordance with some embodiments. The light-sensing regions 116 and the non-light-sensing region 117 are separated from each other by the trenches 118, in accordance with some embodiments.

In some embodiments, the trenches 118 are above the isolation structures 120. The trenches 118 are also referred to as deep trenches, in accordance with some embodiments. In some embodiments, a ratio of a depth D1 of each of the trenches 118 to a thickness T1 of the semiconductor substrate 110 ranges from about 60% to about 90%.

In some embodiments, the ratio of the depth D1 to the thickness T1 of the semiconductor substrate 110 ranges from about 70% to about 80%. In some embodiments, an aspect ratio D1/W of the depth D1 to a width W of each of the trenches 118 ranges from about 6.5 to about 12.5.

Figure 1E:
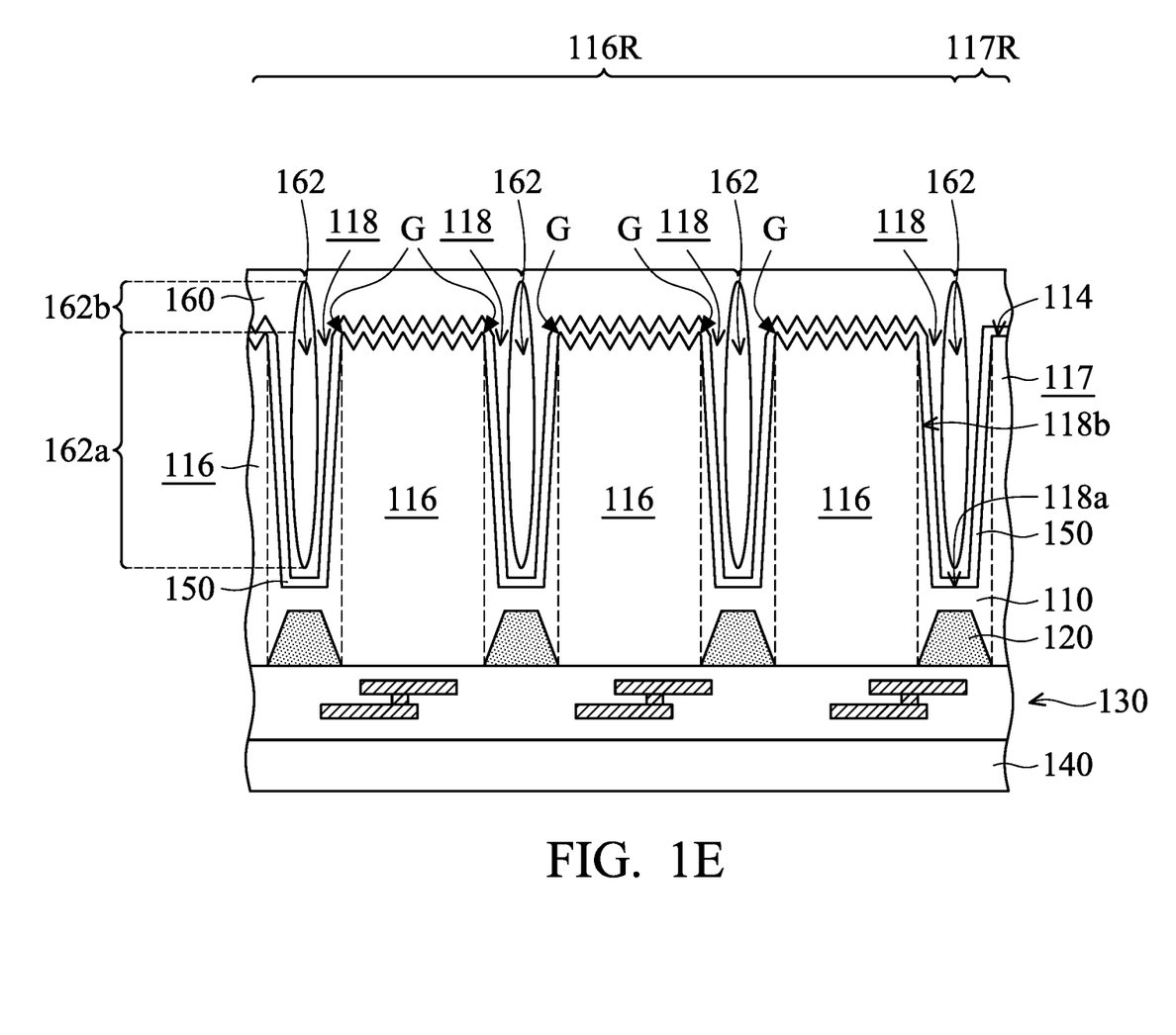

As shown in FIG. 1E, a protection layer 150 is conformally formed over the back surface 114 and bottom surfaces 118a and inner walls 118b of the trenches 118, in accordance with some embodiments. The protection layer 150 is used to induce an electric field in the semiconductor substrate 110 so as to neutralize the charges of the defects of the surface of the semiconductor substrate 110 resulting from the formation of the trenches 118, in accordance with some embodiments. Therefore, the protection layer 150 may reduce or eliminate the noise of the light-sensing regions 116 resulting from the charges.

The protection layer 150 conformally and continuously covers the entire back surface 114 over the light-sensing regions 116, the entire bottom surfaces 118a, and the entire inner walls 118b, in accordance with some embodiments.

The protection layer 150 is made of a high-k material, in accordance with some embodiments. The high-k material may include hafnium oxide, tantalum pentoxide, zirconium dioxide, aluminum oxide, another suitable material, or a combination thereof. The term "high-k material" means a material having a dielectric constant greater than the dielectric constant of silicon dioxide, in accordance with some embodiments.

The protection layer 150 has a first refractive index, and the first refractive index is less than a second refractive index of the semiconductor substrate 110, in accordance with some embodiments.

The dielectric material includes, for example, silicon nitride, silicon oxynitride, another suitable material, or a combination thereof.

As shown in FIG. 1E, an insulating layer 160 is formed over the protection layer 150, in accordance with some embodiments. In some embodiments, the insulating layer 160 is configured to electrically isolate structures subsequently formed in the trenches 118 from the semiconductor substrate 110.

In some embodiments, the insulating layer 160 is also configured to passivate the back surface 114 of the semiconductor substrate 110, the bottom surfaces 118a, and the inner walls 118b of the trenches 118. In some embodiments, the insulating layer 160 is further configured to electrically isolate the light-sensing regions 116 from one another to reduce electrical crosstalk between the light-sensing regions 116.

The insulating layer 160 includes silicon oxides or another suitable insulating material. The first refractive index of the protection layer 150 is greater than a third refractive index of the insulating layer 160, in accordance with some embodiments. The insulating layer 160 is formed by, for example, a chemical vapor deposition process, a physical vapor deposition process, or an atomic layer deposition process.

As shown in FIG. 1E, an edge G is positioned between the back surface 114 and the inner wall 118b of each of the trenches 118, in accordance with some embodiments. The deposition rate of the insulating layer 160 over the edge G is greater than the deposition rate of the insulating layer 160 over the bottom surface 118a and the inner wall 118b of each of the trenches 118, in accordance with some embodiments.

Therefore, voids 162 are formed in the insulating layer 160 in the trenches 118, in accordance with some embodiments. The voids 162 are closed voids, which do not communicate with the environment, in accordance with some embodiments. In some embodiments, each of the voids 162 has a lower portion 162a and an upper portion 162b. The lower portion 162a is in the corresponding trench 118, in accordance with some embodiments. The upper portion 162b is outside of the corresponding trench 118, in accordance with some embodiments.

Figure 1F:
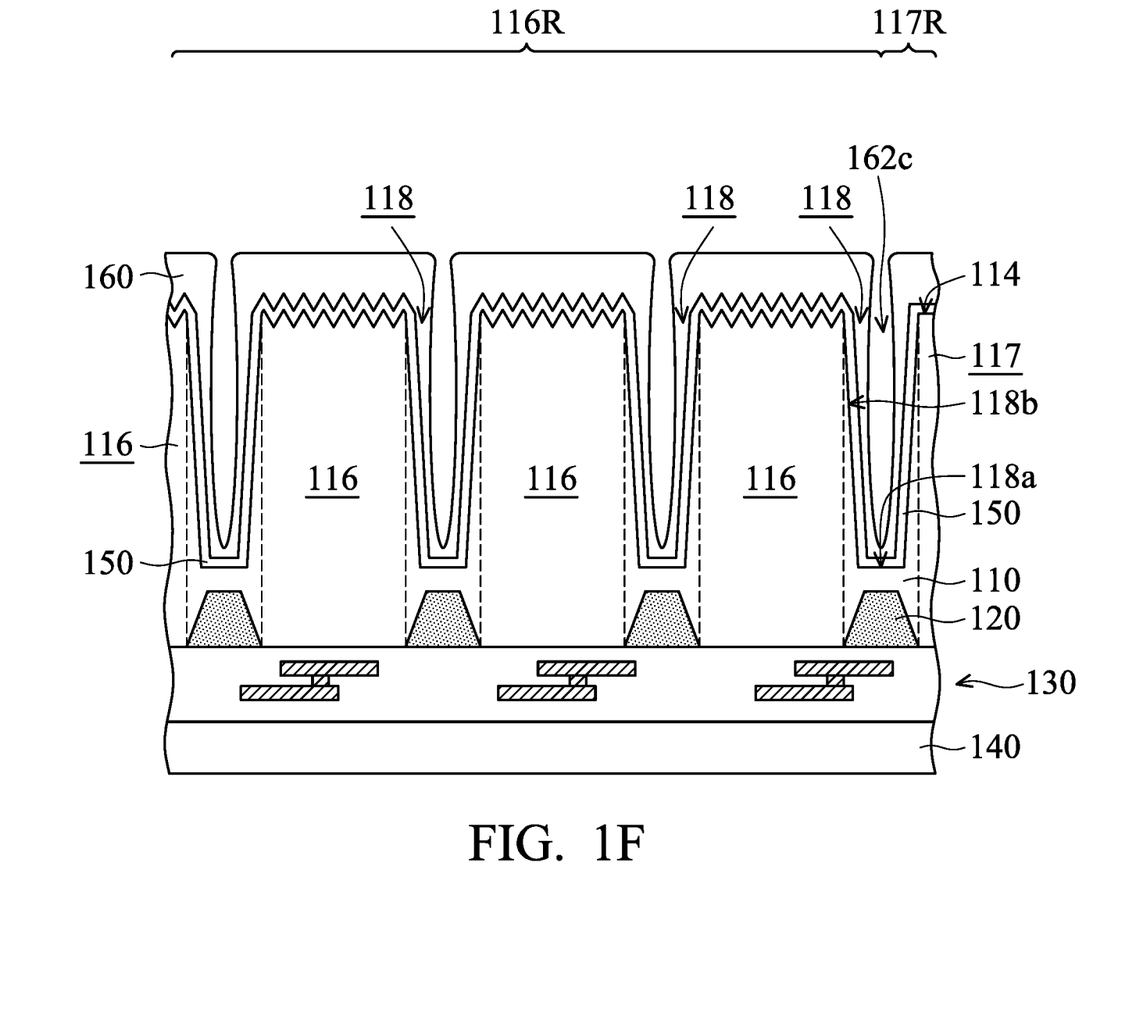

As shown in FIGS. 1E and 1F, portions of the insulating layer 160 over the voids 162 are removed to open up the voids 162, in accordance with some embodiments. The opened voids 162 form trenches 162c partially in the corresponding trenches 118, in accordance with some embodiments. The removal process includes a dry etching process and/or a wet etching process, in accordance with some embodiments.

Figure 1G:
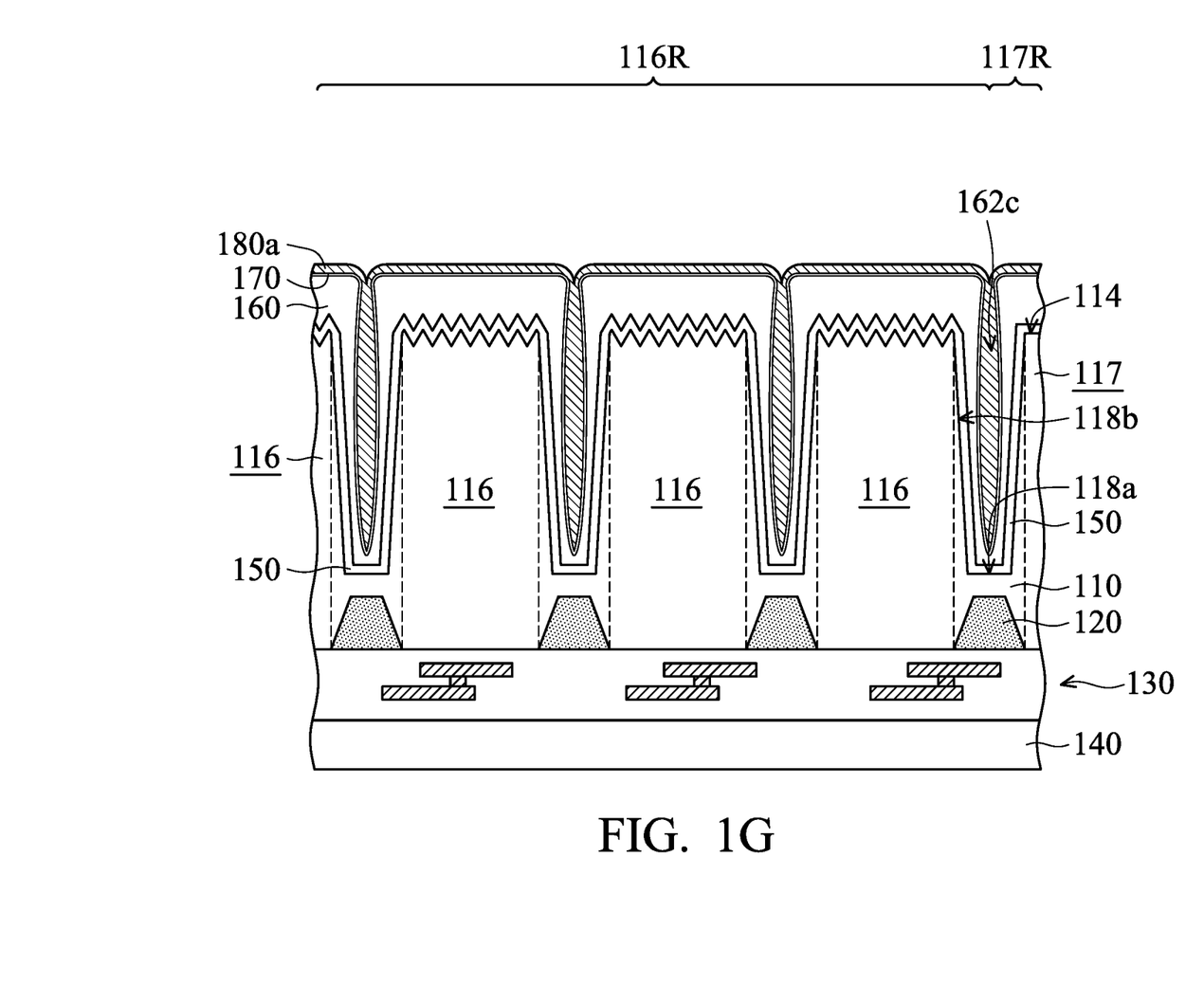

As shown in FIG. 1G, a glue layer 170 is conformally formed over the insulating layer 160, in accordance with some embodiments. The glue layer 170 is configure to improve the adhesion between the insulating layer 160 and a reflective layer subsequently formed on the glue layer 170, in accordance with some embodiments.

The glue layer 170 is made of TiN, TaN, or another suitable material. The glue layer 170 is formed using a chemical vapor deposition (CVD) process, a physical vapor deposition (PVD) process, or another suitable process. In some other embodiments, the glue layer 170 is not formed.

As shown in FIG. 1G, a reflective layer 180a is formed on the glue layer 170 and in the trenches 162c, in accordance with some embodiments. The trenches 162c are filled up with the reflective layer 180a (and the glue layer 170), in accordance with some embodiments. The reflective layer 180a has a light reflectivity ranging from about 70% to about 100%, in accordance with some embodiments.

The reflective layer 180a is made of a metal material, an alloy material, or another suitable reflective material, in accordance with some embodiments. The reflective layer 180a is made of aluminum, silver, copper, titanium, platinum, tungsten, tantalum, alloys thereof, combinations thereof, in accordance with some embodiments. The method of forming the reflective layer 180a includes a chemical vapor deposition (CVD) process, a physical vapor deposition (PVD) process, or another suitable process.

Figure 1H:
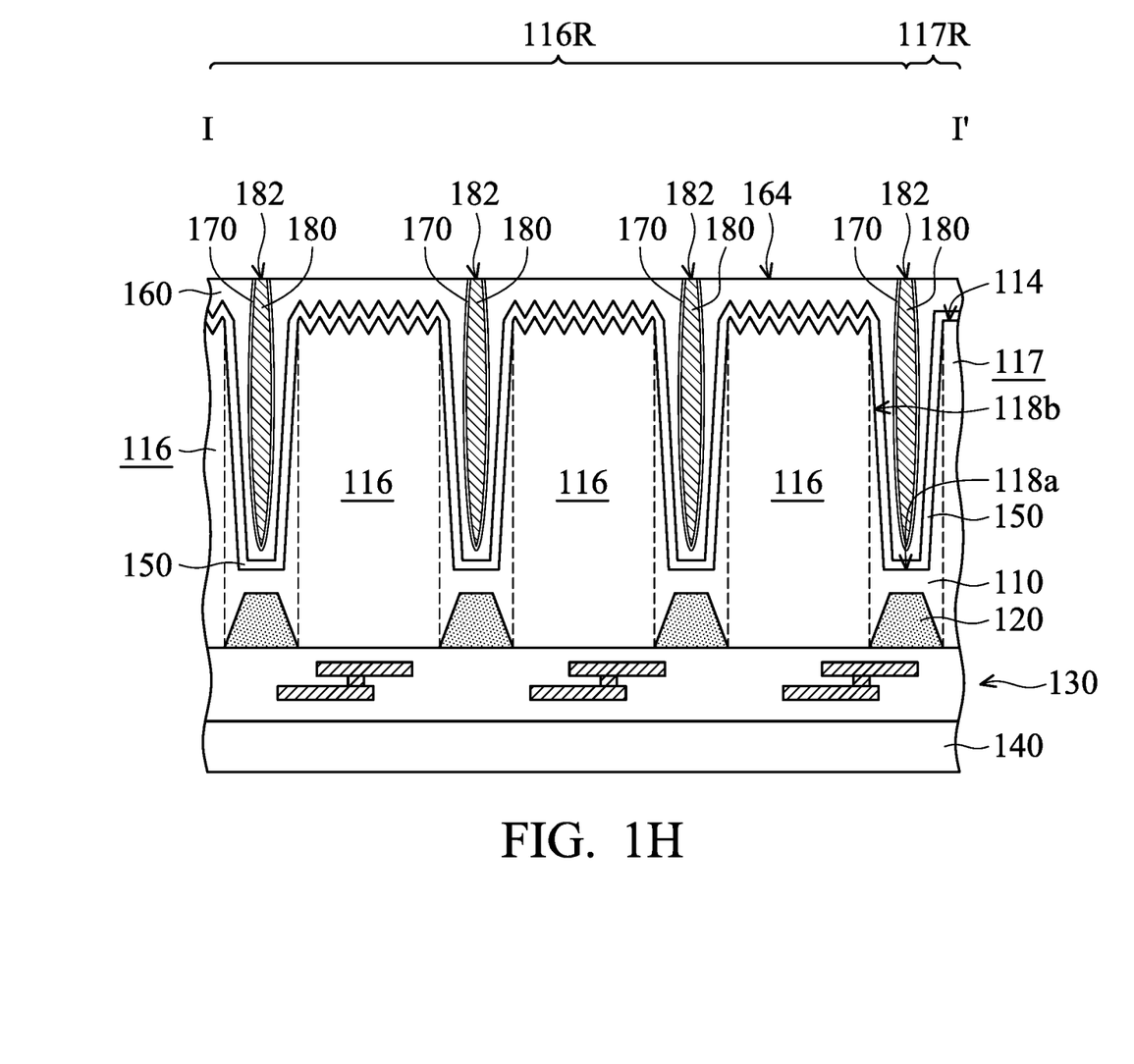

As shown in FIGS. 1G and 1H, the reflective layer 180a outside of the trench 162c is removed, in accordance with some embodiments. The reflective layer 180a remaining in the trench 162c forms a reflective structure 180, in accordance with some embodiments.

The reflective structure 180 is configured to reflect incident light to prevent the incident light from traveling between different light-sensing regions 116, in accordance with some embodiments. Therefore, the reflective structure 180 reduces crosstalk between the light-sensing regions 116, in accordance with some embodiments.

As shown in FIG. 1H, an upper portion of the insulating layer 160 under the removed reflective layer 180a is removed as well, in accordance with some embodiments. The removal process includes a chemical mechanical polishing process, an etching process, or another suitable process. In some embodiments, a top surface 182 of the reflective structure 180 and a top surface 164 of the insulating layer 160 are coplanar.

FIG. 1H-1 is a top view of the image sensor device of FIG. 1H, in accordance with some embodiments. FIG. 1H is a cross-sectional view illustrating the image sensor device along a sectional line I-I' in FIG. 1H-1, in accordance with some embodiments. As shown in FIGS. 1H and 1H-1, the reflective structure 180 continuously surrounds each of the light-sensing regions 116, in accordance with some embodiments.

Figure 1H:
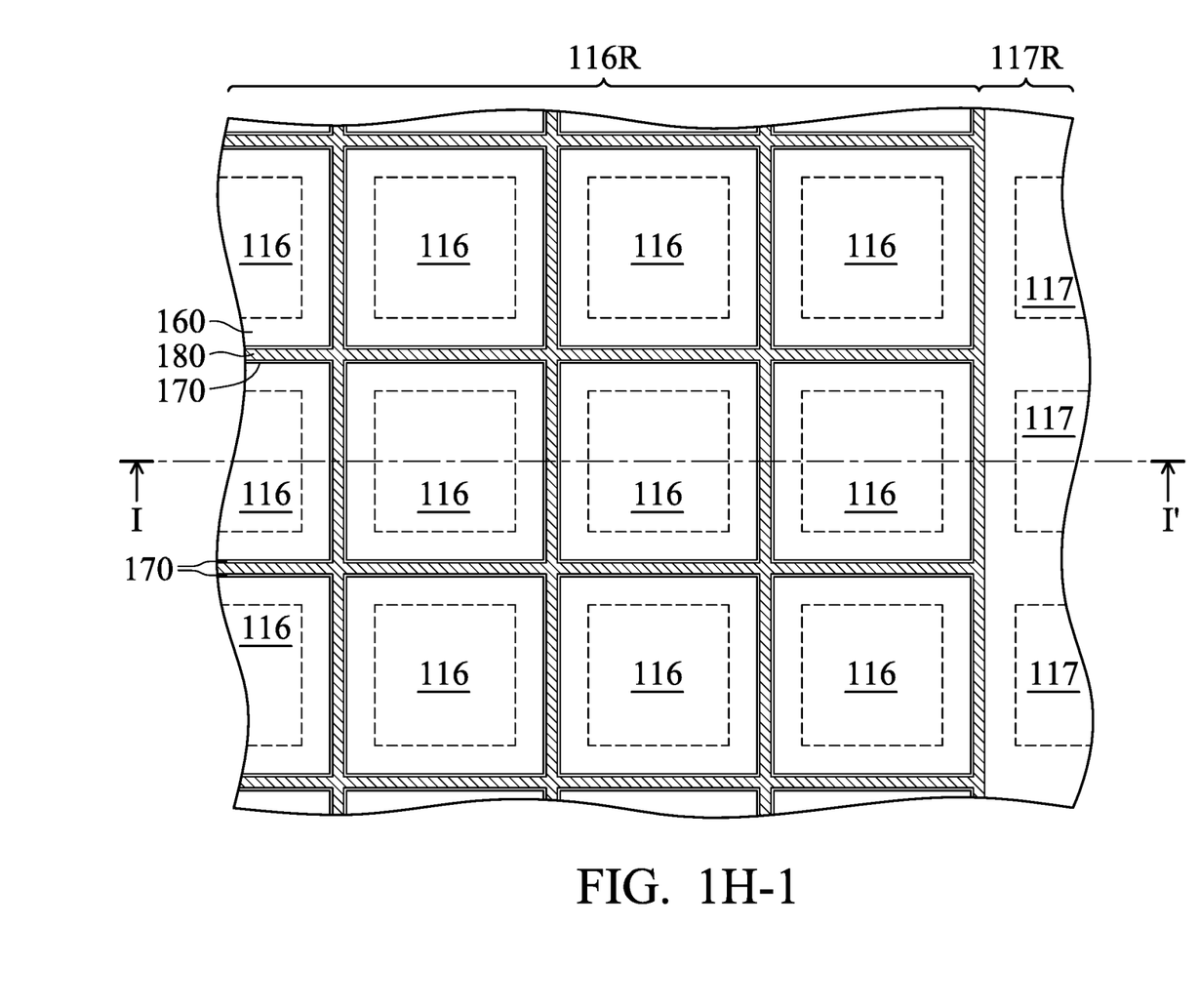

The reflective structure 180 continuously surrounds the entire light-sensing regions 116 or the entire pixel region 116R, in accordance with some embodiments. The reflective structure 180 has a mesh shape, in accordance with some embodiments. The reflective structure 180 is a continuous mesh structure, in accordance with some embodiments.

Figure 1I:
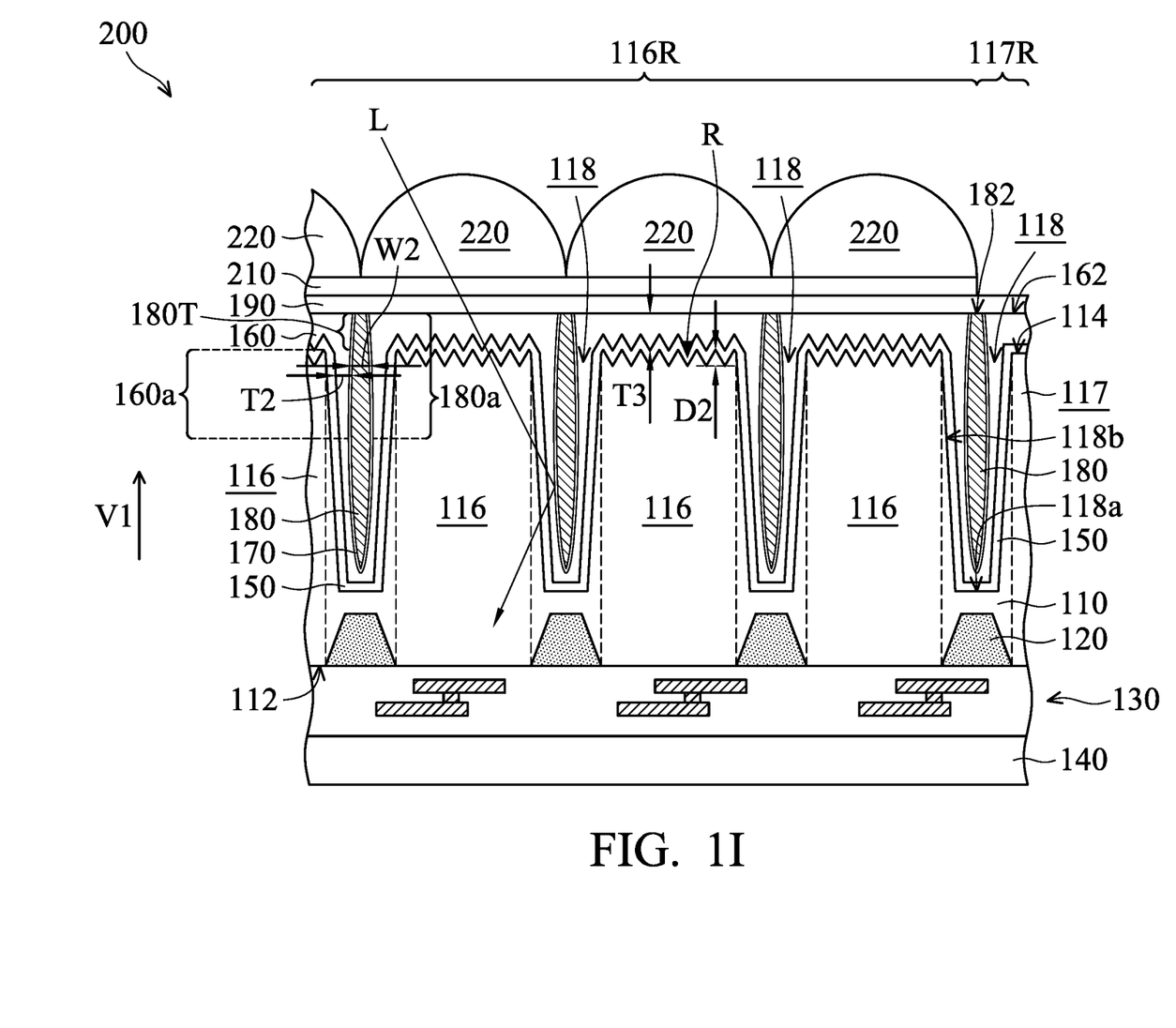

As shown in FIG. 1I, a planarization layer 190 is formed over the top surfaces 182 and 162 of the reflective structure 180 and the insulating layer 160, in accordance with some embodiments. The planarization layer 190 is made of a dielectric material, such as silicon oxide, silicon nitride, silicon oxynitride, another applicable material, or a combination thereof, in accordance with some embodiments. The planarization layer 190 is formed using a chemical vapor deposition process or a physical vapor deposition process, in accordance with some embodiments.

As shown in FIG. 1I, a color filter structure 210 is formed over the planarization layer 190, in accordance with some embodiments. The color filter structure 210 is configured to filter visible light received by the light-sensing regions 116 to pass light in a limited spectrum of wavelengths (e.g., a red wavelength band, a green wavelength band, and/or a blue wavelength band) to the light-sensing regions 116, in accordance with some embodiments. The color filter structure 210 is made of a polymer material or another suitable material.

As shown in FIG. 1I, lenses 220 are formed over the color filter structure 210, in accordance with some embodiments. The lenses 220 are used to direct or focus the incident light. The lenses 220 may include a microlens array. The lenses 220 may be made of a high transmittance material.

For example, the high transmittance material includes a transparent polymer material (such as polymethylmethacrylate, PMMA), a transparent ceramic material (such as glass), another applicable material, or a combination thereof. In this step, an image sensor device 200 is substantially formed, in accordance with some embodiments.

As shown in FIG. 1I, incident light L passing through the light-sensing region 116 and arriving at the reflective structure 180 may be reflected by the reflective structure 180 and thus travel back into the light-sensing region 116. Therefore, the reflective structure 180 may reduce optical crosstalk and improve quantum efficiency.

As shown in FIG. 1I, the lenses 220 and the color filter structure 210 are only formed in the pixel region 116R, and are not formed in the non-pixel region 117R, in accordance with some embodiments. In some embodiments, a thickness T2 of an upper portion 160a of the insulating layer 160 in the trench 118 increases in a direction V1 away from the front surface 112. In some embodiments, a width W2 of an upper portion 180a of the reflective structure 180 decreases in the direction V1. In some embodiments, a width of a lower portion of the reflective structure 180 decreases in a direction toward the front surface 112. The reflective structure 180 has a substantially oval shape, in accordance with some embodiments.

In some embodiments, a top portion 180T of the reflective structure 180 extends out of the trench 118. The insulating layer 160 is a continuous structure, in accordance with some embodiments. In some embodiments, a first average thickness of the insulating layer 160 covering the back surface 114 over the light-sensing regions 116 is greater than a second average thickness of the insulating layer 160 in the trench 118.

In some embodiments, a thickness T3 of the insulating layer 160 covering the back surface 114 over the light-sensing regions 116 is greater than a depth D2 of each of the recesses R. In some embodiments, the insulating layer 160 covers the entire back surface 114 over the light-sensing regions 116, the entire bottom surfaces 118a, and the entire inner walls 118b.

In some embodiments, the isolation structures 120 are under the reflective structure 180. The reflective structure 180 extends from the top surface 162 of the insulating layer 160 toward the isolation structures 120, in accordance with some embodiments. The reflective structure 180 and the isolation structures 120 are between the light-sensing regions 116, in accordance with some embodiments.

In accordance with some embodiments, image sensor devices and methods for forming the same are provided. The methods (for forming the image sensor devices) form a reflective structure in trenches between light-sensing regions in a semiconductor substrate. The reflective structure may reflect incident light arriving at the reflective structure to prevent the incident light from traveling between the different light-sensing regions. The reflected incident light may be directed back into the light-sensing region by the reflective structure. Therefore, optical crosstalk is reduced, and quantum efficiency of the image sensor devices is improved.

In accordance with some embodiments, a method for forming an image sensor device is provided. The method includes providing a semiconductor substrate including a front surface, a back surface opposite to the front surface, at least one light-sensing region close to the front surface, and a first trench surrounding the light-sensing region. The method includes forming an insulating layer over the back surface and in the first trench. A void is formed in the insulating layer in the first trench, and the void is closed. The method includes removing the insulating layer over the void to open up the void. The opened void forms a second trench partially in the first trench. The method includes filling a reflective structure in the second trench. The reflective structure has a light reflectivity ranging from about 70% to about 100%.

In accordance with some embodiments, a method for forming an image sensor device is provided. The method includes providing a semiconductor substrate comprising a front surface, a back surface opposite to the front surface, at least one light-sensing region close to the front surface, and a first trench surrounding the light-sensing region. The method includes forming an insulating layer over the back surface and in the first trench. A void is formed in the insulating layer in the first trench, and the void is closed. The method includes opening up the void. The opened void forms a second trench partially in the first trench. The method includes filling a reflective layer in the second trench. A first width of a first upper portion of the reflective layer decreases in a first direction away from the front surface.

In accordance with some embodiments, a method for forming an image sensor device is provided. The method includes providing a semiconductor substrate comprising a front surface, a back surface opposite to the front surface, at least one light-sensing region close to the front surface, and a trench surrounding the light-sensing region. The method includes roughening the back surface over the light-sensing region. The method includes forming an insulating layer over the back surface and in the trench. A void is formed in the insulating layer in the trench. The method includes removing the insulating layer over the void. The method includes filling a reflective layer in the void.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor device, comprising:
providing a semiconductor substrate comprising a front surface, a back surface opposite to the front surface, at least one light-sensing region close to the front surface, and a first trench surrounding the light-sensing region;
forming an insulating layer over the back surface and in the first trench, wherein a void is formed in the insulating layer in the first trench, and the void is closed;
removing the insulating layer over the void to open up the void, wherein the opened void forms a second trench partially in the first trench; and
filling a reflective structure in the second trench, wherein the reflective structure has a light reflectivity ranging from about 70% to about 100%.

2. The method for forming the image sensor device as claimed in claim 1, further comprising:
before the forming of the insulating layer, removing a portion of the semiconductor substrate adjacent to the back surface over the light-sensing region to increase an average roughness of the back surface over the light-sensing region.

3. The method for forming the image sensor device as claimed in claim 2, further comprising:
after the removal of the portion of the semiconductor substrate and before the forming of the insulating layer, conformally forming a protection layer over the back surface, the inner wall, and the bottom surface, wherein the insulating layer is formed over the protection layer, the protection layer is made of a high-k material having a first refractive index, and the first refractive index is less than a second refractive index of the semiconductor substrate and greater than a third refractive index of the insulating layer.

4. The method for forming the image sensor device as claimed in claim 1, wherein the formation of the reflective structure comprises:
depositing a reflective layer over the insulating layer and in the second trench, wherein the second trench is filled up with the reflective layer; and
removing the reflective layer outside of the second trench, wherein the reflective layer remaining in the second trench forms the reflective structure.

5. The method for forming the image sensor device as claimed in claim 4, wherein the removal of the reflective layer outside of the second trench further comprises:
removing a portion of the insulating layer under the removed reflective layer.

6. The method for forming the image sensor device as claimed in claim 1, wherein a top portion of the reflective structure extends out of the first trench, and a first top surface of the reflective structure and a second top surface of the insulating layer are coplanar.

7. The method for forming the image sensor device as claimed in claim 1, further comprising:
forming an isolation structure in the semiconductor substrate and adjacent to the front surface, wherein the isolation structure is under the reflective structure.

8. The method for forming the image sensor device as claimed in claim 7, wherein a portion of the insulating layer is between the reflective structure and the isolation structure.

9. The method for forming the image sensor device as claimed in claim 8, wherein a portion of the semiconductor substrate is between the insulating layer and the isolation structure.

10. The method for forming the image sensor device as claimed in claim 1, wherein the insulating layer is a continuous structure, and a first average thickness of the insulating layer covering the back surface over the light-sensing region is greater than a second average thickness of the insulating layer in the first trench.

11. A method for forming an image sensor device, comprising:
providing a semiconductor substrate comprising a front surface, a back surface opposite to the front surface, at least one light-sensing region close to the front surface, and a first trench surrounding the light-sensing region;
forming an insulating layer over the back surface and in the first trench, wherein a void is formed in the insulating layer in the first trench, and the void is closed;
opening up the void, wherein the opened void forms a second trench partially in the first trench; and
filling a reflective layer in the second trench, wherein a first width of a first upper portion of the reflective layer decreases in a first direction away from the front surface.

12. The method for forming the image sensor device as claimed in claim 11, wherein a second width of a first lower portion of the reflective layer decreases in a second direction toward the front surface.

13. The method for forming the image sensor device as claimed in claim 12, wherein a first thickness of a second upper portion of the insulating layer increases in the first direction away from the front surface.

14. The method for forming the image sensor device as claimed in claim 13, wherein a second thickness of a second lower portion of the insulating layer increases in the second direction toward the front surface.

15. The method for forming the image sensor device as claimed in claim 11, wherein a width of the first trench decreases in a second direction toward the front surface.

16. A method for forming an image sensor device, comprising:
providing a semiconductor substrate comprising a front surface, a back surface opposite to the front surface, at least one light-sensing region close to the front surface, and a trench surrounding the light-sensing region;
roughening the back surface over the light-sensing region;
forming an insulating layer over the back surface and in the trench, wherein a void is formed in the insulating layer in the trench;
removing the insulating layer over the void; and
filling a reflective layer in the void.

17. The method for forming the image sensor device as claimed in claim 16, further comprising:
after roughening the back surface over the light-sensing region, conformally forming a protection layer over the back surface and in the trench, wherein the insulating layer is formed over the protection layer, and the protection layer is made of a high-k material.

18. The method for forming the image sensor device as claimed in claim 17, wherein the high-k material has a first refractive index, and the first refractive index is less than a second refractive index of the semiconductor substrate and greater than a third refractive index of the insulating layer.

19. The method for forming the image sensor device as claimed in claim 16, further comprising:
conformally forming a glue layer over the insulating layer before filling the reflective layer in the void, wherein the reflective layer is formed over the glue layer.

20. The method for forming the image sensor device as claimed in claim 16, wherein a first average roughness of the back surface over the light-sensing region is greater than a second average roughness of a top surface of the insulating layer.

* * * * *